(12) United States Patent
Lam (10) Patent No.: US 10,277,201 B2
(45) Date of Patent: *Apr. 30, 2019

(54) TEMPERATURE COMPENSATED DIGITAL STEP ATTENUATOR

(71) Applicant: pSemi Corporation, San Diego, CA (US)

(72) Inventor: Fleming Lam, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/981,722

(22) Filed: May 16, 2018

(65) Prior Publication Data

US 2018/0262181 A1 Sep. 13, 2018

Related U.S. Application Data

(63) Continuation of application No. 15/287,335, filed on Oct. 6, 2016, now Pat. No. 10,003,322.

(51) Int. Cl.
*H03H 11/24* (2006.01)
*H03H 7/24* (2006.01)
*H01P 1/22* (2006.01)
*H03H 7/25* (2006.01)

(52) U.S. Cl.
CPC .......... *H03H 11/245* (2013.01); *H01P 1/22* (2013.01); *H03H 7/24* (2013.01); *H03H 7/251* (2013.01)

(58) Field of Classification Search
CPC ........ H03H 11/245; H03H 11/24; H03H 7/24; H03H 7/25; H03H 7/251; H01P 1/22

USPC .............. 333/81 R, 81 A; 327/308, 309, 317
See application file for complete search history.

(56) References Cited

U.S. PATENT DOCUMENTS

| | | |
|---|---|---|
| 5,332,981 A | 7/1994 | Mazzochette et al. |
| 6,278,313 B1 | 8/2001 | Kakuta et al. |
| 6,472,949 B1 | 10/2002 | Yamazaki et al. |
| 7,256,664 B1 | 8/2007 | Blacka et al. |
| 8,212,648 B2 | 7/2012 | Yan et al. |

(Continued)

OTHER PUBLICATIONS

Jones, Stephen E., Notice of Allowance received from the USPTO dated Apr. 30, 2018 for U.S. Appl. No. 15/287,335, 8 pgs.

*Primary Examiner* — Stephen E. Jones
(74) *Attorney, Agent, or Firm* — Jaquez Land Greenhaus LLP; Martin J. Jaquez, Esq.; John Land, Esq.

(57) ABSTRACT

Circuits and methods for eliminating or mitigating the amount of temperature-dependent variation in the relative attenuation of a multi-valued digital step attenuator (DSA) by using resistive components having temperature-dependent resistance values that compensate for or offset changes in the temperature-dependent ON resistance ($R_{ON}$) of the switches within the DSA. In some embodiments, DSA attenuator cell switches are fabricated to have positive first-order resistance temperature (FORT) coefficients, while temperature-compensating series attenuation resistances are fabricated as a positive FORT coefficient resistor and temperature-compensating shunt resistances are fabricated as either a negative FORT coefficient resistor or a combination of a negative FORT coefficient resistor in parallel with a positive FORT coefficient resistor.

21 Claims, 6 Drawing Sheets

(56) References Cited

U.S. PATENT DOCUMENTS

| 8,614,597 | B2* | 12/2013 | Zhang | H03H 11/245 |
| | | | | 327/308 |
| 10,003,322 | B2* | 6/2018 | Lam | H03H 11/245 |
| | | | | 333/81 R |
| 2014/0266518 | A1 | 9/2014 | Wang et al. | |
| 2018/0102763 | A1 | 4/2018 | Lam | |

* cited by examiner

TEMPERATURE COMPENSATED DIGITAL STEP ATTENUATOR

CROSS-REFERENCE TO RELATED APPLICATIONS—CLAIM OF PRIORITY

The present application is a continuation of co-pending U.S. application Ser. No. 15/287,335, filed Oct. 6, 2016, entitled "Temperature Compensated Digital Step Attenuator", which is herein incorporated by reference in its entirety.

BACKGROUND

(1) Technical Field

This invention relates to electronic circuits, and more particularly to electronic digital step attenuator circuits.

(2) Background

An attenuator is an electronic device that reduces the power of a signal, and is frequently used in combination with other electronic circuitry to provide gain control, adjust power levels, provide compensation for variations in temperature, and/or improve impedance matching. When used to process radio frequency (RF) signals, ideally an attenuator reduces signal power without appreciably distorting the signal waveform. For RF applications, attenuators typically comprise a small network of passive (and, optionally, active) devices. Classic examples of single-valued RF attenuators are two-port Bridged-T type, Pi-type, T-type, and L-pad type attenuators.

Multiple single-valued RF attenuators of various types may be connected to provide for a selectable amount of attenuation in a circuit. Sometimes known as digital step attenuators (DSAs), a typical DSA consists of a series cascade of selectable single-valued RF attenuator cells. A selectable attenuator cell may be configured as a series-type attenuator or as a shunt-type attenuator. A series-type attenuator cell is designed to have two selectable states: (1) an attenuation state, and (2) a bypass state. The bypass state is normally provided by a switch connected in parallel with the input and output ports of an attenuator network (e.g., two-port Bridged-T type, Pi-type, T-type, or L-pad type attenuator). A shunt-type attenuator cell is also designed to have two selectable states: (1) an attenuation state, and (2) a disconnected state. The disconnected state is normally provided by a switch connected between an RF signal line and RF circuit ground. In either type of attenuator cell, the switch is often a field effect transistor (FET), and is commonly a MOSFET.

Conventional DSAs exhibit changes in electrical performance due to component variation as a function of temperature (both ambient and circuit induced). One key parameter for DSAs is "relative attenuation", which is defined as the amount of attenuation relative to the reference state of the constituent attenuator cells (usually expressed in decibels). It is desirable for relative attenuation to remain constant with temperature changes. In actual conventional DSA implementations, this is not the case as the design components (e.g., transistors, resistors, and capacitors) which make up the DSA generally exhibit different electrical properties with temperature changes. The end result is relative attenuation error which varies with temperature.

Accordingly, an object of the present invention is the elimination or mitigation of relative attenuation error in a DSA as a function of temperature.

SUMMARY OF THE INVENTION

The invention includes circuits and methods for eliminating or mitigating the amount of temperature-dependent variation in the relative attenuation of a multi-valued DSA by using resistive components having temperature-dependent resistance values that compensate for changes in the temperature-dependent ON resistance ($R_{ON}$) of the switches within the DSA.

In some embodiments, DSA attenuator cell switches are fabricated to have positive first-order resistance temperature (FORT) coefficients, while temperature-compensating series attenuation resistances are fabricated as a positive FORT coefficient resistor and temperature-compensating shunt resistances are fabricated as either a negative FORT coefficient resistor or a combination of a negative FORT coefficient resistor in parallel with a positive FORT coefficient resistor.

In the most general case, the principles described below can be applied to embodiments where the DSA attenuator cell switches in a circuit may be selected to have either positive and negative FORT coefficients (or even a combination of positive and negative FORT coefficients), and where the associated series and shunt attenuation resistances are selected to have some combination of temperature-compensating positive and/or negative FORT coefficients to substantially compensate for or offset changes in the temperature-dependent $R_{ON}$ of the switches within the DSA.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention includes circuits and methods for eliminating or mitigating the amount of temperature-dependent variation in the relative attenuation of a multi-valued DSA by using resistive components having temperature-dependent resistance values that compensate for or offset changes in the temperature-dependent ON resistance ($R_{ON}$) of the switches within the DSA.

In some embodiments, DSA attenuator cell switches are fabricated to have positive first-order resistance temperature (FORT) coefficients, while temperature-compensating series attenuation resistances are fabricated as a positive FORT coefficient resistor and temperature-compensating shunt resistances are fabricated as either a negative FORT coefficient resistor or a combination of a negative FORT coefficient resistor in parallel with a positive FORT coefficient resistor.

DSA Structure and Behavior

Figure 1:
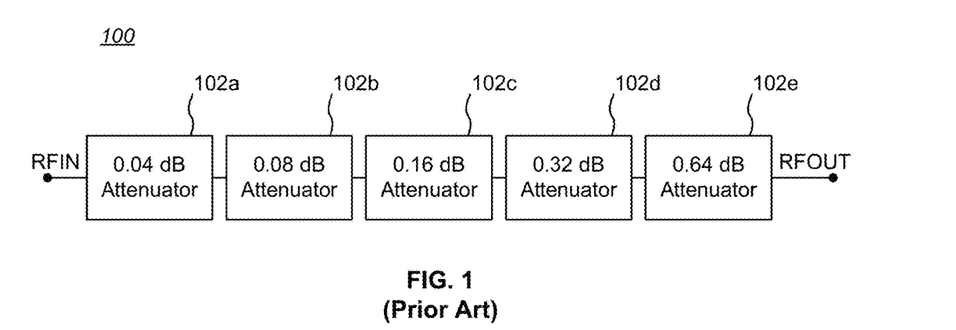
FIG. 1 is a block diagram of a prior art DSA having five selectable attenuator cells.

FIG. 1 is a block diagram 100 of a prior art DSA having five selectable attenuator cells 102a-102e. In the illustrated embodiment, any of 32 binary-coded combinations of the attenuator cells 102a-102e may be selected by external control circuitry (not shown) so as to provide 32 different attenuation states. In the illustrated example, the available attenuation steps range from 0.04 dB to 0.64 dB, but other attenuation values for the attenuator cells 102a-102e may be used for other applications, a DSA may comprise more or fewer attenuator cells 102a-102e than shown, and coding schemes other than binary may be used (e.g., thermometer coding or hybrid thermometer and binary coding).

Figure 2:
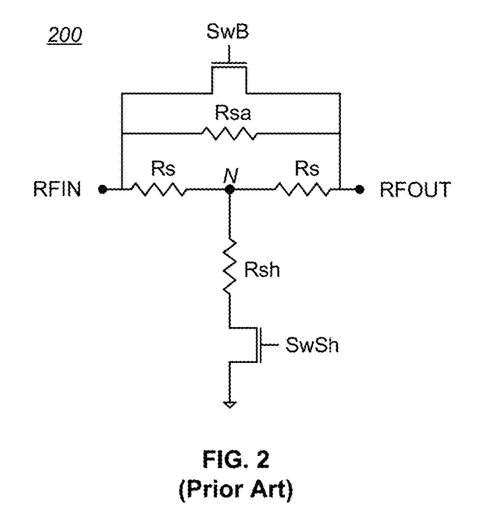
FIG. 2 is a schematic diagram of a prior art Bridged-T type attenuator which may be used as a series-type attenuator cell in a DSA.

A series-type attenuator cell may comprise an attenuator network of various configurations. FIG. 2 is a schematic diagram of a prior art Bridged-T type attenuator 200 which may be used as a series-type attenuator cell in a DSA. In this example, a pair of series-connected impedance matching resistors Rs are coupled between an RFIN port and an RFOUT port (the attenuator architecture 200 is generally symmetrical, hence the port labels are normally arbitrary). A series attenuating resistor Rsa spans the series-connected matching resistors Rs, and is also coupled between the RFIN and RFOUT ports. A bypass switch SwB also spans the series-connected matching resistors Rs in parallel with the series attenuating resistor Rsa, and is similarly coupled between the RFIN and RFOUT ports. A shunt resistor Rsh is coupled between a node N interposed between the series-connected matching resistors Rs and a shunt switch SwSh, which in turn is coupled to a selected potential, normally RF circuit ground. (Note that "RF ground" in the context of this disclosure refers to a ground connection suitable for RF circuitry, rather than to "digital" ground typically used for DC and/or low frequency digital circuits and/or as an electro-static discharge return path.)

With the Bridged-T type attenuator 200 shown in FIG. 2, turning bypass switch SwB ON (i.e., setting the transistor to an electrically conductive state) while turning shunt switch SwSh OFF (i.e., setting the transistor to an electrically blocking state) effectively disconnects the shunt resistor Rsh from the signal path between the RFIN and RFOUT ports, and creates a signal path from the RFIN port to the RFOUT port that bypasses the series-connected matching resistors Rs and the series attenuating resistor Rsa. Such a bypass state can be considered to configure the Bridged-T type attenuator 200 in a "reference state", with the reference state insertion loss determined essentially by the ON resistance, $R_{ON}$, of the bypass switch SwB.

To place the Bridged-T type attenuator 200 shown in FIG. 2 in an attenuation state, bypass switch SwB is turned OFF while shunt switch SwSh is turned ON. The end result is an attenuator configuration comprising the series-connected impedance matching resistors Rs, the series attenuating resistor Rsa, and the shunt resistor Rsh. For a typical modern RF application, the impedance matching resistors Rs would each have a resistance value of 50 ohms, but other values may be used to match the characteristic impedance of a system in other applications. Overall, the amount of attenuation provided by the attenuator cell circuit of FIG. 2 depends mainly on the resistance values of the series attenuating resistor Rsa and the shunt resistor Rsh (the resistance of the shunt resistor Rsh is commonly chosen to be much greater than the ON resistance of the shunt switch SwSh). This applies as well to other attenuator architectures, such as Pi-type (two shunt resistors Rsh), T-type, and L-pad type attenuators.

Figure 3:
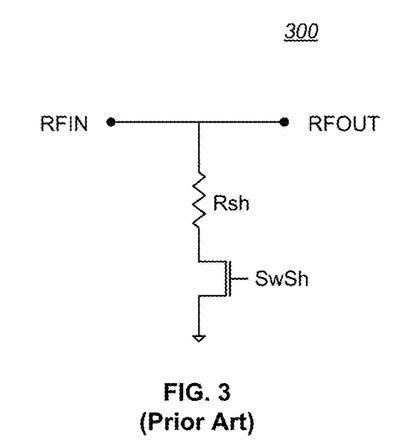
FIG. 3 is a schematic diagram of a prior art shunt-type attenuator which may be used in a DSA.

FIG. 3 is a schematic diagram of a prior art shunt-type attenuator 300 which may be used in a DSA. In this example, setting the shunt switch SwSh to OFF (i.e., non-conducting) effectively disconnects the shunt resistor Rsh from the signal path between the RFIN and RFOUT ports, and creates a signal path from the RFIN port to the RFOUT port (i.e., a non-attenuating reference state). Setting the shunt switch SwSh to ON (i.e., conducting) connects the shunt resistor Rsh between a selected potential (normally RF circuit ground) and the signal path between the RFIN and RFOUT ports, providing a level of attenuation determined primarily by the value of the shunt resistor Rsh (again, the resistance of which is commonly chosen to be much greater than the ON resistance of the shunt switch SwSh). The shunt resistor Rsh normally has a large value in order to achieve a small level of attenuation without drawing a significant amount of current to ground.

The amount of attenuation in a DSA is specified relative to the reference state loss of the constituent selectable attenuator cells. For example, referring to the Bridged-T type attenuator 200 in FIG. 2, the resistance values of the series attenuating resistor Rsa and the shunt resistor Rsh are carefully chosen based on the reference state loss determined by the ON resistance, $R_{ON}$, of the series bypass switch SwB.

As the temperature of a DSA changes, the ON (i.e., conducting state) resistance of its associated bypass and/or shunt switches also changes. More specifically, an increase in temperature results in a higher value of $R_{ON}$ for each such switch, which translates to a higher reference state loss. Accordingly, to maintain essentially the same relative attenuation error requires that the DSA provide more attenuation at higher temperatures when set to the attenuation state, so that the difference in attenuation between the attenuation state and the reference state remains approximately constant. This same principle applies to cases where $R_{ON}$ decreases with increasing temperature, rather than increases. It was realized that, in either case, the individual attenuation resistances within each attenuator cell should change in value with changing temperature in order to compensate for or offset the increase or decrease to $R_{ON}$ for each switch.

For example, referring to FIG. 2, as temperature increases, the resistance of the series attenuating resistor Rsa could be designed to increase in order to offset the higher transistor $R_{ON}$ resistance of the series bypass switch SwB and preserve the same relative attenuation. Similarly, again referring to FIG. 2, as temperature increases, the resistance of the shunt resistor Rsh could be designed to decrease in order to offset the increase in reference state loss due to the increased transistor $R_{ON}$ resistance of the series bypass switch SwB with increasing temperature.

With respect to FIG. 2 and FIG. 3, as temperature increases, the ON resistance of the shunt switch SwSh would increase as well. However, the increase in the ON resistance of the shunt switch SwSh with increasing temperature is not particularly significant, since the total shunt resistance is the sum of the resistances of the shunt resistor Rsh and the shunt switch SwSh, and the shunt resistor Rsh is commonly chosen to be much greater than the ON resistance of the shunt switch SwSh and thus is the dominant resistance term. Still, designing the shunt resistor Rsh to decrease in resistance with temperature would result in higher attenuation in both attenuator types, which is desired to help preserve the same relative attenuation of the attenuator cell.

Temperature-Compensated DSA Architecture

In embodiments of the invention, compensation for the temperature-dependent resistance behavior of the switch transistors of a DSA is achieved by using resistor elements within the DSA attenuator cells that have appropriate counter-acting first-order resistance temperature (FORT) coefficients.

Figure 4:
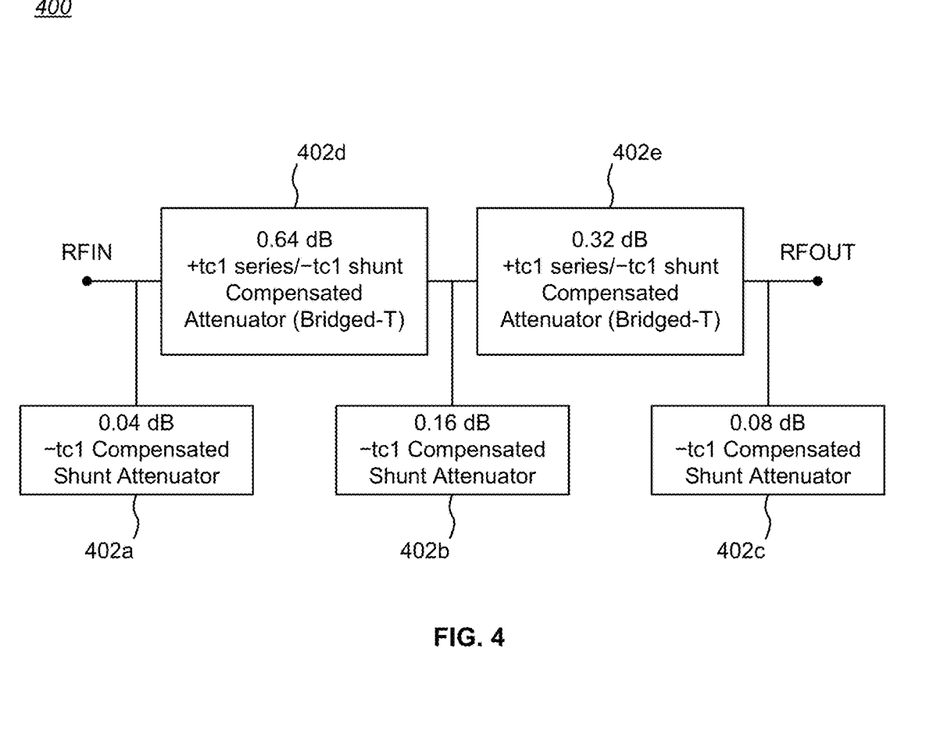
FIG. 4 is a block diagram of one embodiment of a DSA having temperature-compensated attenuator cells.

For example, FIG. 4 is a block diagram of one embodiment of a DSA 400 having temperature-compensated attenuator cells. In the illustrated example, the DSA 400 has five sequentially-coupled attenuator cells 402a-402e, divided between three shunt-type attenuator cells 402a-402c and two interleaved series-type attenuator cells 402d-402e.

In the example of FIG. 4, the series attenuators 402d-402e are Bridged-T type attenuators having at least one resistor element with a positive FORT coefficient (i.e., +tc1) and at least one resistor element with a negative FORT coefficient (i.e., -tc1), as described in greater detail below. The shunt attenuators 402a-402c have at least one resistor element with a negative FORT coefficient (i.e., -tc1), also as described in greater detail below.

The available attenuation steps for the example DSA 400 shown in FIG. 4 range from 0.04 dB to 0.64 dB, but other attenuation values for the attenuator cells 402a-402e may be used for other applications, and a DSA may comprise more or fewer temperature-compensated attenuator cells 402a-402e than shown. Further, while the series attenuators 402d-402e are shown by way of illustration as Bridged-T types, other series-type attenuators may be used for particular applications. The coding scheme for the DSA 400 may be binary coding, thermometer coding, or a hybrid of thermometer and binary coding.

Temperature-Compensated Attenuators

Figure 5:
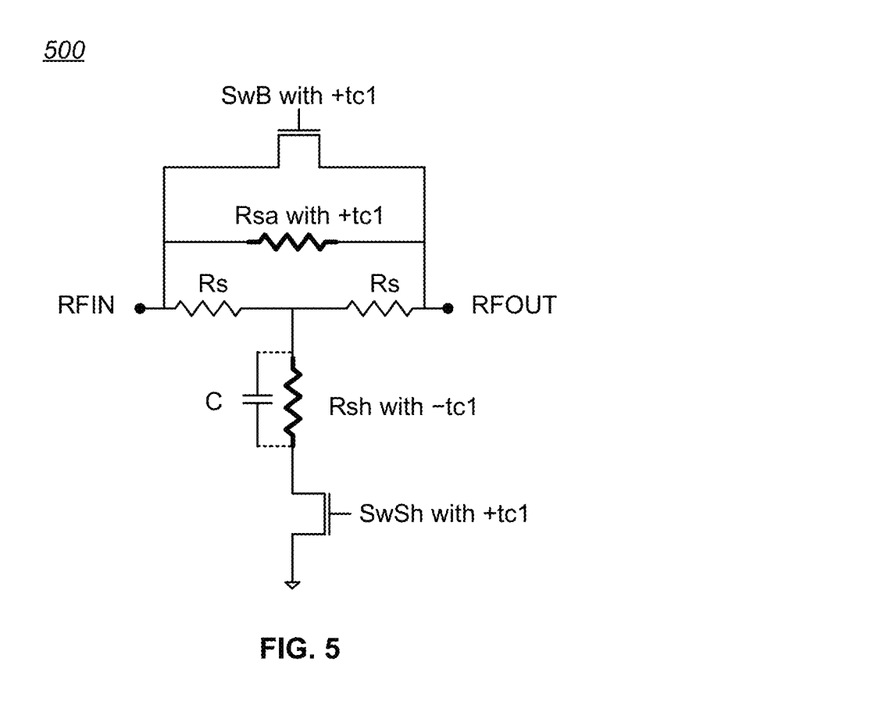
FIG. 5 is a schematic diagram of a series-type Bridged-T attenuator cell using multiple resistor elements having compensating FORT coefficients and suitable for use in the DSA of FIG. 4.

FIG. 5 is a schematic diagram of a series-type Bridged-T attenuator cell 500 using multiple resistor elements having compensating FORT coefficients and suitable for use in the DSA of FIG. 4. The transistor bypass switch SwB and the shunt switch SwSh each have a positive FORT coefficient, +tc1. To counteract the increase in their respective $R_{ON}$ resistance values as temperature increases, the series attenuating resistor Rsa is fabricated so as to have a positive FORT coefficient, while the shunt resistor Rsh is fabricated so as to have a negative FORT coefficient, -tc1. Thus, as temperature increases, the positive FORT coefficient of the series attenuating resistor Rsa causes an increase in the resistance of Rsa, which offsets the increase in the ON resistance $R_{ON}$ of the parallel bypass switch SwB (which determines the reference state loss), so that the difference in attenuation between the attenuation state and the reference state remains approximately constant. In addition, the negative FORT coefficient of the shunt resistor Rsh causes a decrease in the resistance of Rsh with increasing temperature, thereby introducing more attenuation to help offset the increased reference state loss due to the increased $R_{ON}$ resistance of the bypass switch SwB. (As noted above, despite having a positive FORT coefficient, the increasing $R_{ON}$ resistance of the shunt switch SwSh with increasing temperature plays a lesser role in the overall attenuation of the cell, since its ON resistance is normally chosen to be much smaller than the $R_{ON}$ resistance of a shunt resistor Rsh having a negative FORT coefficient). The overall result is the maintenance of a more constant relative attenuation error within the attenuator cell 500 as temperature varies.

Figure 6:
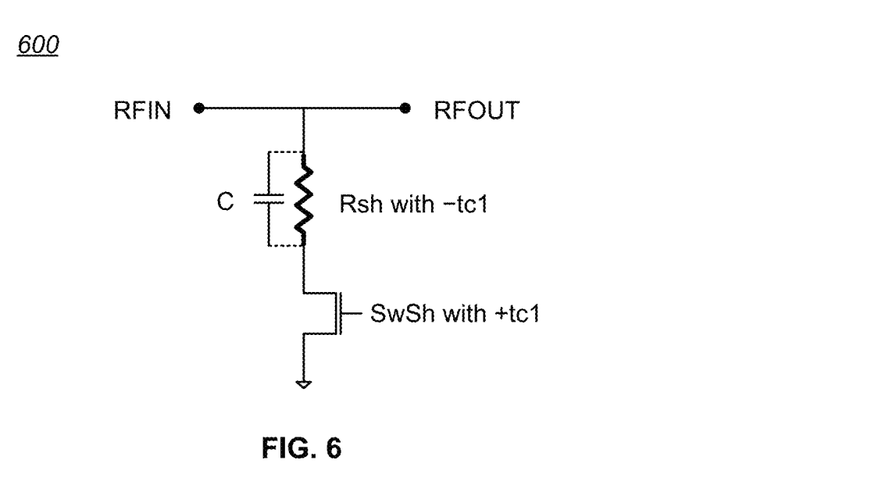
FIG. 6 is a schematic diagram of a shunt-type attenuator cell using a resistor element having a compensating FORT coefficient and suitable for use in the DSA of FIG. 4.

FIG. 6 is a schematic diagram of a shunt-type attenuator cell 600 using a resistor element having a compensating FORT coefficient and suitable for use in the DSA of FIG. 4. The transistor shunt switch SwSh has a positive FORT coefficient. As shown in FIG. 4, a normal practice is to connect one or more shunt-type attenuator cells with one or more series-type attenuator cells (such as Bridged-T, Pi-type, or L-type). The reference state loss is determined by the total $R_{ON}$ resistance of all the series bypass switches in the signal path for a particular DSA architecture. If the DSA series bypass switches comprise transistors with positive FORT coefficient, each shunt resistor Rsh in a shunt-type attenuator cell may be fabricated so as to have a negative FORT coefficient to counteract the increase in total $R_{ON}$ resistance of the series bypass switches in connected series-type attenuator cells, which principally set the reference state loss for the DSA as a whole. Thus, as temperature increases, the negative FORT coefficient of a shunt resistor Rsh causes a decrease in its resistance, which offsets the increase in the total ON resistance $R_{ON}$ caused by the series bypass switches connected in series with the shunt-type attenuator cell. Again, this results in a more constant relative attenuation with changing temperature.

Note that in some embodiments, an optional compensation capacitor C may be included in parallel with a shunt resistor Rsh to improve the bandwidth of an attenuator cell; see, for example, the capacitor C in FIG. 5 and FIG. 6 shown optionally connected by dotted lines. Adding capacitor compensation may degrade the return loss of an attenuator cell as a function of frequency since, for higher frequencies, the input/output of an attenuator cell begins to look capacitive. However, in many applications, the improvement in bandwidth is worth the tradeoff of some return loss.

As should be clear, if the switches in a shunt-type or series-type attenuator cell are fabricated using some circuit technique or fabrication technology so as to have a negative FORT coefficient, then the compensating resistor elements described above would have opposite FORT coefficients. For example, if the series-type Bridged-T attenuator cell 500 shown in FIG. 5 is fabricated such that shunt switch SwB has a negative FORT coefficient, then in order to off-set that negative FORT coefficient, the series attenuating resistor Rsa would be fabricated so as to have a negative FORT coefficient and the shunt resistor Rsh would be fabricated so as to have a positive FORT coefficient.

Figure 7:
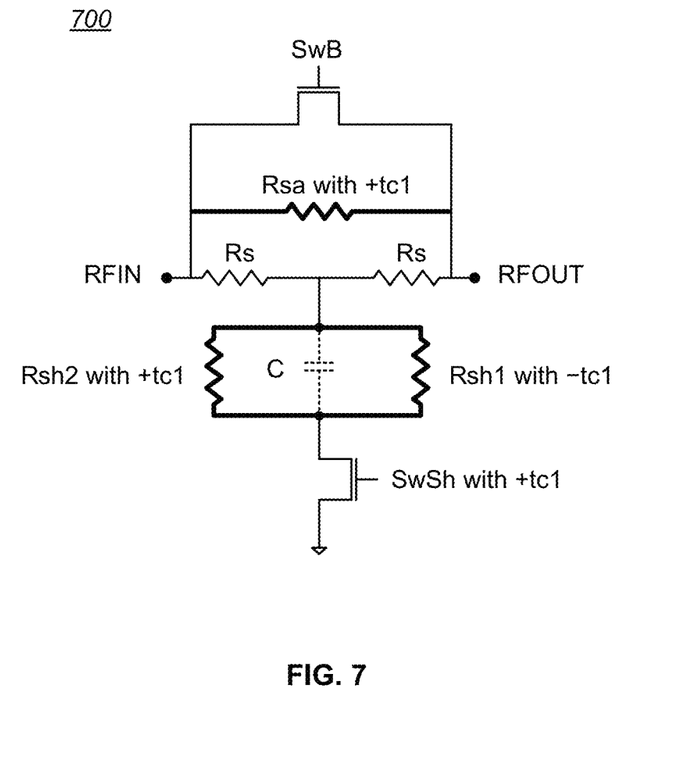
FIG. 7 is a schematic diagram of another embodiment of a series-type Bridged-T attenuator cell using multiple resistor elements having compensating FORT coefficients and suitable for use in the DSA of FIG. 4.

In some applications, the technologies available for fabricating transistors and resistors may not enable close balancing of the FORT coefficients of a transistor switch and a single resistor element. In such cases, a combination of resistor elements with different FORT coefficients may provide for better compensation. For example, the magnitude of the negative FORT coefficient for a shunt resistor fabricated in a particular technology may be too large and overcompensate for the temperature-induced increase in resistance caused by the series bypass switches in the signal path. Accordingly, a shunt resistor having a smaller magnitude positive FORT coefficient may be connected in parallel with a shunt resistor having a negative FORT coefficient to achieve better compensation. For example, FIG. 7 is a schematic diagram of another embodiment of a series-type Bridged-T attenuator cell 700 using multiple resistor elements having compensating FORT coefficients and suitable for use in the DSA of FIG. 4. It was determined through design simulation that reduced variation in relative attenuation with temperature may be better achieved by fabricating the series attenuating resistor Rsa with a positive FORT coefficient, as in FIG. 5, but replacing the shunt resistance Rsh with a parallel combination of a first resistor Rsh1 having a negative FORT coefficient in parallel with a second resistor Rsh2 having a positive FORT coefficient. In a simulation of the circuit shown in FIG. 7, the combination of negative and positive FORT coefficient resistors for the shunt resistance resulted in a more favorable FORT coefficient for the equivalent total parallel resistance (i.e., Rtotal= (Rsh1×Rsh2)/(Rsh1+Rsh2)) than was achievable with a shunt resistor implementation using only one or more negative FORT coefficient resistors. As should be clear, one or more additional parallel resistors Rsh# with positive or negative FORT coefficients may be used as needed to achieve a desired level of temperature compensation.

In the most general case, the principles described herein can be applied to embodiments where the DSA attenuator cell switches in a circuit may be selected to have either positive and negative FORT coefficients (or even a combination of positive and negative FORT coefficients), and where the associated series and shunt attenuation resistances are selected to have some combination of temperature-compensating positive and/or negative FORT coefficients to substantially compensate for or offset changes in the temperature-dependent $R_{ON}$ of the switches within the DSA.

Fabrication of Temperature-Compensated Resistors

As is known, different materials and techniques may be used to fabricate resistors on an integrated circuit (IC) die. For example, in a typical CMOS fabrication process, resistors may be fabricated from (among other materials) metal (typically very low sheet resistance); different levels of polycrystalline materials, such as polysilicon (low to very high sheet resistance); N-type and/or P-type diffusion regions (typically low to high sheet resistance); and N-well regions (typically high sheet resistance). However, it is normal for the FORT coefficients of the resistors and transistors on an IC to be of the same polarity.

In a selected IC fabrication technology, each resistor type will have its own resistance temperature coefficients (first order, tc1, and second order, tc2). For example, TABLE 1 tabulates the FORT coefficient of two resistor types in a selected CMOS IC fabrication technology:

TABLE 1

| Resistance Temperature | Resistor Type | |
| --- | --- | --- |
| Coefficient Parameter | Polycrystalline | Diffusion |
| tc1 | −2.00E−04 | +1.54E−03 |
| tc2 | 4.50E−07 | 1.34E−06 |

By careful choice of resistor type, one or more resistor elements can be fabricated with an appropriate counteracting FORT coefficient to reduce the relative attenuation error of a DSA with temperature, as described above. The exact desired compensating FORT coefficient may not be available in a particular technology, but a combination of two or more different resistor types with different polarity FORT coefficients may be used to achieve an effective FORT coefficient which results in reduced relative attenuation error with changing temperature, as in the example shown in FIG. 7.

Graph of Normalized Monotonicity with Different Resistor Implementations

One way to assess the relative attenuation accuracy of a DSA is to examine monotonicity across the full range of attenuation states provided by the DSA. The definition of monotonicity used here is the difference between insertion loss of two adjacent attenuation states separated by a step size equal to the minimum attenuation of the DSA (otherwise known as the "least significant bit", or LSB). Monotonicity can be presented in a normalized fashion by subtracting the LSB value on a decibel scale. Hence, an ideal attenuator would have a normalized monotonicity of 0 dB across all attenuation states. This would represent a DSA with perfect relative attenuation accuracy.

Figure 8A:
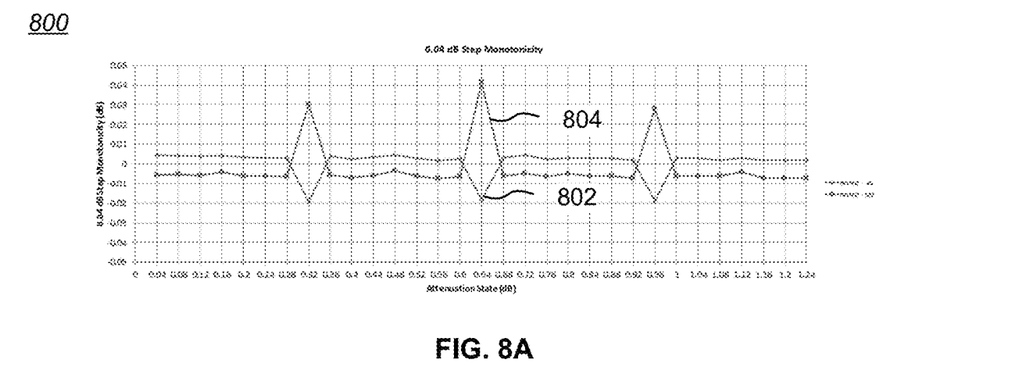
FIG. 8A is a graph of simulated normalized monotonicity and relative attenuation error across attenuation states for an embodiment of the DSA shown in FIG. 4 using only positive FORT coefficient resistors for all attenuator cell resistors.

FIG. 8A is a graph 800 of simulated normalized monotonicity and relative attenuation error across attenuation states for an embodiment of the DSA shown in FIG. 4 using only positive FORT coefficient resistors for all attenuator cell resistors. The graph 800 shows a first plot line 802 corresponding to a temperature of −40° C., and a second plot line 804 corresponding to a temperature of 105° C. The separation in the two plot lines 802, 804 from each other and from 0 dB demonstrates the temperature dependent nature of the relative attenuation error across attenuation states.

Figure 8B:
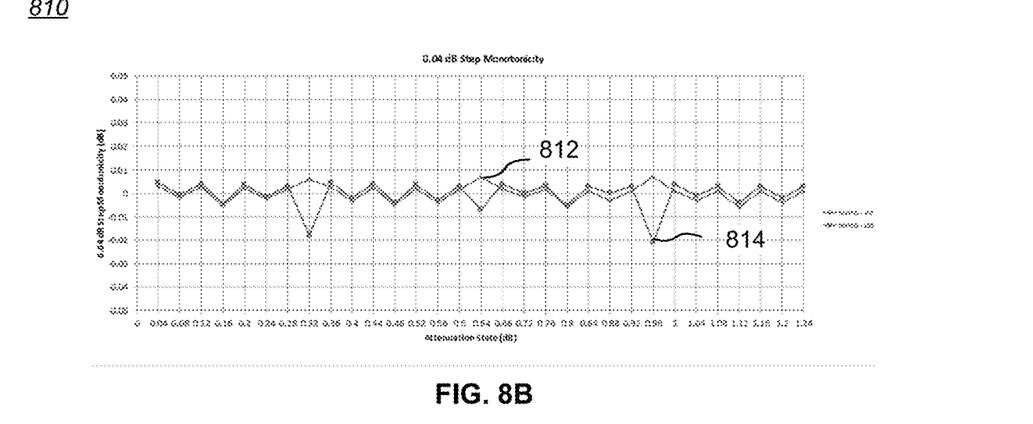
FIG. 8B is a graph of simulated normalized monotonicity and relative attenuation error across attenuation states for an embodiment of the DSA shown in FIG. 4 using positive FORT attenuating series resistors but negative FORT coefficient shunt resistors.

FIG. 8B is a graph 810 of simulated normalized monotonicity and relative attenuation error across attenuation states for an embodiment of the DSA shown in FIG. 4 using positive FORT attenuating series resistors but negative FORT coefficient shunt resistors. Again, the graph 810 shows a first plot line 812 corresponding to a temperature of −40° C., and a second plot line 814 corresponding to a temperature of 105° C. As compared to the graph 800 of FIG. 8A, both plot lines 812, 814 of FIG. 8B more closely conform to 0 dB for all plot points, and thus demonstrate improvement in normalized monotonicity—and thus relative attenuation error—by using negative FORT coefficient resistors for all shunt resistors in the attenuator cells.

Figure 8C:
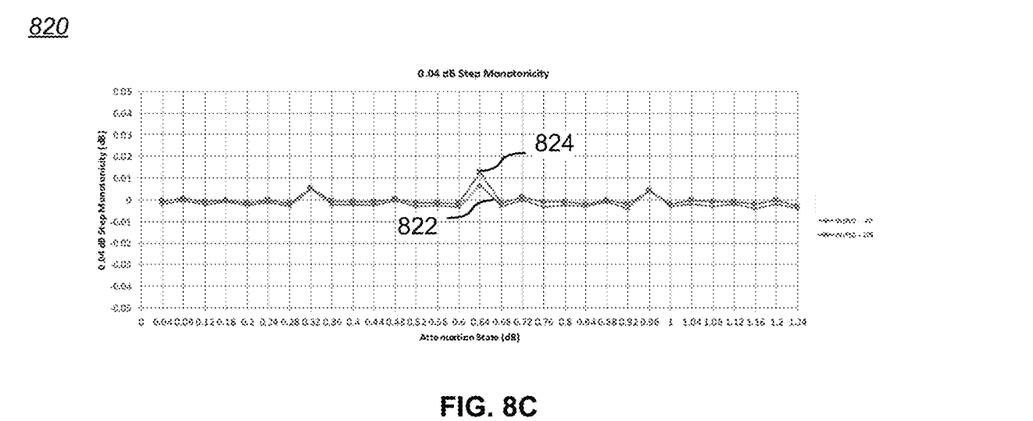
FIG. 8C is a graph of simulated normalized monotonicity and relative attenuation error across attenuation states for an embodiment of the DSA shown in FIG. 4 using positive FORT attenuating series resistors, negative FORT coefficient shunt resistors in shunt-type attenuator cells, and a combination of a negative FORT coefficient resistor and a parallel positive FORT coefficient resistor for the shunt resistance in series-type attenuator cells, as shown in FIG. 7.

FIG. 8C is a graph 820 of simulated normalized monotonicity and relative attenuation error across attenuation states for an embodiment of the DSA shown in FIG. 4 using positive FORT attenuating series resistors, negative FORT coefficient shunt resistors in shunt-type attenuator cells, and a combination of a negative FORT coefficient resistor and a parallel positive FORT coefficient resistor for the shunt resistance in series-type attenuator cells, as shown in FIG. 7. Once again, the graph 820 shows a first plot line 822 corresponding to a temperature of −40° C., and a second plot line 824 corresponding to a temperature of 105° C. As compared to the graph 800 of FIG. 8A and even the graph 810 of FIG. 8B, both plot lines 822, 824 of FIG. 8C more closely conform to 0 dB for all plot points, and thus demonstrate a further reduction in variation in relative attenuation.

Embodiments of the invention may be considered to encompass at least:

A temperature-compensated attenuator cell, including: at least one switch, each having a first-order resistance temperature coefficient of a first type (i.e., positive or negative); and at least one resistance element, each coupled to a corresponding switch and having a first-order resistance temperature coefficient of a compensating type with respect to the coupled corresponding switch (i.e., positive or negative, depending on whether the corresponding switch is shunt or series connected within the attenuator cell).

A temperature-compensated attenuator cell, including: a shunt switch having a first-order resistance temperature coefficient of a first type (i.e., positive or negative); and a resistance element coupled to the shunt switch and having a first-order resistance temperature coefficient of a second type complementary (i.e., negative or positive) to the first-order resistance temperature coefficient of the first type.

A temperature-compensated attenuator cell, including: a shunt switch having a first-order resistance temperature coefficient of a first type (i.e., positive or negative); a shunt resistance element coupled to the shunt switch and having a first-order resistance temperature coefficient of a second type complementary (i.e., negative or positive) to the first-order resistance temperature coefficient of the first type; a series switch having a first-order resistance temperature coefficient of the first type; and a series resistance element coupled to the series switch and having a first-order resistance temperature coefficient of the first type.

Methods

Figure 9:
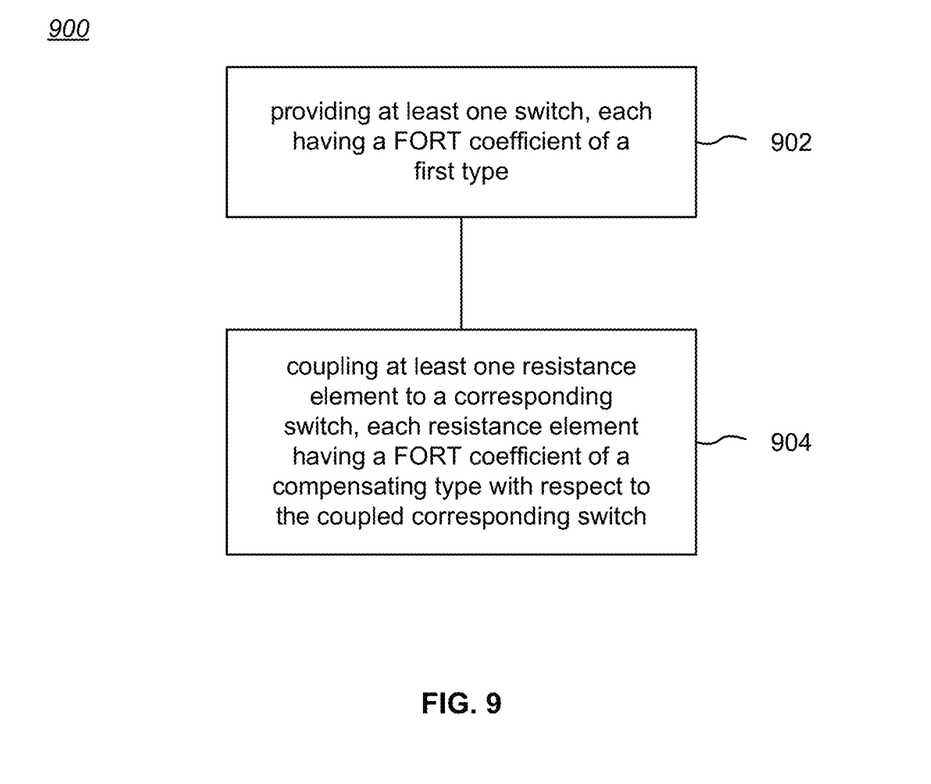
FIG. 9 is a flowchart describing one method for temperature-compensating an attenuator cell.

An aspect of the invention includes a method for temperature-compensating an attenuator cell. For example, FIG. 9 is a flowchart 900 describing one method for temperature-compensating an attenuator cell. The method includes: providing at least one switch, each having a first-order resistance temperature coefficient of a first type (STEP 902); and coupling at least one resistance element to a corresponding switch, each resistance element having a first-order resistance temperature coefficient of a compensating type with respect to the coupled corresponding switch (STEP 904).

Yet another aspect of the invention includes a method for temperature-compensating an attenuator cell, including: providing a shunt switch having a first-order resistance temperature coefficient of a first type; and coupling a resistance element to the shunt switch, the resistance element having a first-order resistance temperature coefficient of a second type complementary to the first-order resistance temperature coefficient of the first type.

Still Another aspect of the invention includes a method for temperature-compensating an attenuator cell, including: providing at least one shunt switch having a first-order resistance temperature coefficient of a first type; providing at least one shunt resistance element, each coupled to a corresponding shunt switch and having a first-order resistance temperature coefficient of a second type complementary to the first-order resistance temperature coefficient of the first type; coupling at least one series resistance element operatively to at least one shunt resistance element in an attenuation configuration, the at least one series resistance element having a first-order resistance temperature coefficient of the first type; and coupling a series switch in parallel across at least one series resistance, the series switch having a first-order resistance temperature coefficient of the first type.

Another aspect of the invention includes a method for temperature-compensating an attenuator cell, including: providing at least one shunt switch having a first-order resistance temperature coefficient of a first type; providing at least one shunt resistance element, each coupled to a corresponding shunt switch, and each including a first resistor having a first-order resistance temperature coefficient of a second type complementary to the first-order resistance temperature coefficient of the first type, and a second resistor coupled in parallel with the first resistor and having a first-order resistance temperature coefficient of the first type; operatively coupling at least one series resistance element to at least one shunt resistance element in an attenuation configuration, the least one series resistance element having a first-order resistance temperature coefficient of the first type; and coupling a series switch in parallel across at least one series resistance, the series switch having a first-order resistance temperature coefficient of the first type.

The one or more of the above methods may include: the first-order resistance temperature coefficient of the first type being a positive first-order resistance temperature coefficient; the first-order resistance temperature coefficient of the second type being a negative first-order resistance temperature coefficient; and/or sequentially coupling at least two attenuator cells in a digital step attenuator configuration.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation. Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A temperature-compensated attenuator cell, including:
   (a) a switch having a first-order resistance temperature coefficient of a first type; and
   (b) a resistance element coupled to the switch, the resistance element having a first-order resistance temperature coefficient of a compensating type with respect to the coupled switch.

2. A temperature-compensated attenuator cell, including:
   (a) at least one series resistance element operatively coupled in an attenuation configuration and having a first-order resistance temperature coefficient of a first type; and
   (b) at least one shunt resistance element coupled to a corresponding shunt switch and operatively coupled to the at least one series resistance element in an attenuation configuration, at least a first one of the at least one shunt resistance element having a first-order resistance temperature coefficient of a second type complementary to the first-order resistance temperature coefficient of the first type;
   wherein the at least one series resistance element and the at least one shunt resistance element are configured such that a difference in attenuation between an attenuation state and a reference state of the temperature-compensated attenuator cell remains approximately constant as temperature varies.

3. The invention of claim 2, further including a series switch coupled in parallel across at least one of the at least one series resistance element, for selectively bypassing the at least one series resistance element.

4. The invention of claim 3, wherein the series switch has a first-order resistance temperature coefficient of the first type.

5. The invention of claim 2, wherein the first-order resistance temperature coefficient of the first type has a first magnitude, and the first-order resistance temperature coefficient of the second type has a second magnitude different from the first magnitude.

6. A temperature-compensated attenuator cell, including:
   (a) at least one series resistance element operatively coupled in an attenuation configuration and having a first-order resistance temperature coefficient of a first type; and
   (b) at least one shunt resistance element coupled to a corresponding shunt switch and operatively coupled to the at least one series resistance element in an attenuation configuration, at least a first one of the at least one shunt resistance element having a first-order resistance temperature coefficient of a second type complementary to the first-order resistance temperature coefficient of the first type, and at least a second one of the at least one shunt resistance element having a first-order resistance temperature coefficient of the first type;
   wherein the at least one series resistance element and the at least one shunt resistance element are configured such that a difference in attenuation between an attenuation state and a reference state of the temperature-compensated attenuator cell remains approximately constant as temperature varies.

7. The invention of claim 6, wherein the first-order resistance temperature coefficient of the first type has a first magnitude, and the first-order resistance temperature coefficient of the second type has a second magnitude.

8. The invention of claim 6, further including a series switch coupled in parallel across at least one of the at least one series resistance element, for selectively bypassing the at least one series resistance element.

9. The invention of claim 8, wherein the series switch has a first-order resistance temperature coefficient of the first type.

10. A temperature-compensated attenuator cell, including:
    (a) at least one switch, at least one of the at least one switch having a first-order resistance temperature coefficient of a first type; and
    (b) at least one resistance element coupled to a corresponding switch, at least one of the at least one resistance element having a first-order resistance temperature coefficient of a compensating type with respect to the coupled corresponding switch.

11. A temperature-compensated digital step attenuator including at least two sequentially-coupled temperature-compensated attenuator cells, each cell including:
    (a) at least one series resistance element operatively coupled in an attenuation configuration and having a first-order resistance temperature coefficient of a first type; and
    (b) at least one shunt resistance element coupled to a corresponding shunt switch and operatively coupled to the at least one series resistance element in an attenuation configuration, at least a first one of the at least one shunt resistance element having a first-order resistance temperature coefficient of a second type complementary to the first-order resistance temperature coefficient of the first type;
    wherein the at least one series resistance element and the at least one shunt resistance element for each cell are configured such that a difference in attenuation between an attenuation state and a reference state of such temperature-compensated attenuator cell remains approximately constant as temperature varies.

12. The invention of claim 11, wherein the first-order resistance temperature coefficient of the first type has a first magnitude, and the first-order resistance temperature coefficient of the second type has a second magnitude different from the first magnitude.

13. The invention of claim 11, wherein at least one cell further includes a series switch coupled in parallel across at least one of the at least one series resistance element, for selectively bypassing the at least one series resistance element.

14. The invention of claim 13, wherein the series switch has a first-order resistance temperature coefficient of the first type.

15. A temperature-compensated digital step attenuator including at least two sequentially-coupled temperature-compensated attenuator cells, each cell including:
  (a) at least one series resistance element operatively coupled in an attenuation configuration and having a first-order resistance temperature coefficient of a first type; and
  (b) at least one shunt resistance element coupled to a corresponding shunt switch and operatively coupled to the at least one series resistance element in an attenuation configuration, at least a first one of the at least one shunt resistance element having a first-order resistance temperature coefficient of a second type complementary to the first-order resistance temperature coefficient of the first type, and at least a second one of the at least one shunt resistance element having a first-order resistance temperature coefficient of the first type;
  wherein the at least one series resistance element and the at least one shunt resistance element for each cell are configured such that a difference in attenuation between an attenuation state and a reference state of such temperature-compensated attenuator cell remains approximately constant as temperature varies.

16. The invention of claim 15, wherein the first-order resistance temperature coefficient of the first type has a first magnitude, and the first-order resistance temperature coefficient of the second type has a second magnitude different from the first magnitude.

17. The invention of claim 15, wherein at least one cell further includes a series switch coupled in parallel across at least one of the at least one series resistance element, for selectively bypassing the at least one series resistance element.

18. The invention of claim 17, wherein the series switch has a first-order resistance temperature coefficient of the first type.

19. A temperature-compensated digital step attenuator including at least two sequentially-coupled temperature-compensated attenuator cells, each cell including at least one of:
  (a) at least one series resistance element operatively coupled in an attenuation configuration and having a first-order resistance temperature coefficient of a first type; a series bypass switch coupled in parallel across at least one of the at least one series resistance element, for selectively bypassing the at least one series resistance element; and at least one shunt resistance element coupled to a corresponding shunt switch and operatively coupled to the at least one series resistance element in an attenuation configuration, wherein at least a first one of the at least one shunt resistance element has a first-order resistance temperature coefficient of a second type complementary to the first-order resistance temperature coefficient of the first type; or
  (b) a shunt switch, and at least one shunt resistance element operatively coupled to the shunt switch in an attenuation configuration, wherein at least a first one of the at least one shunt resistance element has a first-order resistance temperature coefficient of the second type;
  wherein the at least one series resistance element and the at least one shunt resistance element are configured such that a difference in attenuation between an attenuation state and a reference state of at least one of the at least two temperature-compensated attenuator cells remains approximately constant as temperature varies.

20. The invention of claim 19, wherein at least a second one of the at least one shunt resistance element has a first-order resistance temperature coefficient of the first type.

21. The invention of claim 19, wherein at least one series bypass switch has a first-order resistance temperature coefficient of the first type.

* * * * *